United States Patent
Kang et al.

(10) Patent No.: US 11,309,389 B2
(45) Date of Patent: Apr. 19, 2022

(54) EPITAXIAL WAFER AND SWITCH ELEMENT AND LIGHT-EMITTING ELEMENT USING SAME

(71) Applicant: LX Semicon Co., Ltd., Daejeon (KR)

(72) Inventors: Seok Min Kang, Seoul (KR); Ji Hye Kim, Seoul (KR); Heung Teak Bae, Seoul (KR)

(73) Assignee: LX Semicon Co., Ltd., Daejeon (KR)

( * ) Notice: Subject to any disclaimer, the term of this patent is extended or adjusted under 35 U.S.C. 154(b) by 0 days.

(21) Appl. No.: 14/648,609

(22) PCT Filed: Nov. 21, 2013

(86) PCT No.: PCT/KR2013/010646
§ 371 (c)(1),
(2) Date: May 29, 2015

(87) PCT Pub. No.: WO2014/084550
PCT Pub. Date: Jun. 5, 2014

(65) Prior Publication Data
US 2015/0295049 A1    Oct. 15, 2015

(30) Foreign Application Priority Data

Nov. 30, 2012 (KR) .................. 10-2012-0137986
May 21, 2013 (KR) .................. 10-2013-0057087
Jun. 28, 2013 (KR) .................. 10-2013-0075376

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02378* (2013.01); *H01L 21/02521* (2013.01);
(Continued)

(58) Field of Classification Search
None
See application file for complete search history.

(56) References Cited

U.S. PATENT DOCUMENTS 4,918,497 A * 4/1990 Edmond ................. H01L 33/34
257/103
5,027,168 A * 6/1991 Edmond ............. H01L 33/0008
257/103
(Continued)

FOREIGN PATENT DOCUMENTS

CN       102656297 A    9/2012
JP       2007-284298 A   11/2007
(Continued)

OTHER PUBLICATIONS

SIPO Office Action for Chinese Application No. 201380071151.X dated Dec. 29, 2016, which corresponds to the above-referenced U.S. application.
(Continued)

*Primary Examiner* — Bo B Jang
(74) *Attorney, Agent, or Firm* — Birch, Stewart, Kolasch & Birch, LLP

(57) ABSTRACT

An epitaxial wafer includes an epitaxial layer disposed on a substrate. The epitaxial layer includes a first semiconductor layer disposed on the substrate and a second semiconductor layer disposed on the first semiconductor layer and having a thickness that is thicker than that of the first semiconductor layer. A surface defect density of the second semiconductor layer is 0.1/cm$^2$ or less.

10 Claims, 9 Drawing Sheets

(51) Int. Cl.
*H01L 29/06* (2006.01)
*H01L 29/872* (2006.01)
*H01L 29/78* (2006.01)
*H01L 29/08* (2006.01)
*H01L 33/34* (2010.01)
*H01L 33/32* (2010.01)
*H01L 29/32* (2006.01)
*H01L 33/02* (2010.01)
*H01L 33/00* (2010.01)

(52) U.S. Cl.
CPC .... *H01L 21/02529* (2013.01); *H01L 29/0619* (2013.01); *H01L 29/0873* (2013.01); *H01L 29/7802* (2013.01); *H01L 29/872* (2013.01); *H01L 33/025* (2013.01); *H01L 33/34* (2013.01); *H01L 29/32* (2013.01); *H01L 33/007* (2013.01); *H01L 33/32* (2013.01)

(56) References Cited

U.S. PATENT DOCUMENTS

| | | | |
|---|---|---|---|
| 5,338,944 A * | 8/1994 | Edmond | H01L 33/0008 257/101 |
| 5,670,414 A * | 9/1997 | Fang | H01L 21/02529 117/93 |
| 6,271,544 B1 * | 8/2001 | Fang | H01L 29/267 257/191 |
| 6,774,407 B2 * | 8/2004 | Kushida | H01L 21/263 257/131 |
| 7,018,554 B2 * | 3/2006 | Sumakeris | H01L 21/30608 117/951 |
| 7,173,285 B2 * | 2/2007 | Hallin | C30B 25/18 257/77 |
| 7,199,442 B2 * | 4/2007 | Shenoy | H01L 21/0495 257/155 |
| 7,821,015 B2 * | 10/2010 | Mazzola | H01L 21/8213 257/103 |
| 7,994,035 B2 * | 8/2011 | Matsuyama | H01L 21/049 438/585 |
| 8,399,948 B2 * | 3/2013 | Yoon | H01L 33/06 257/449 |
| 8,421,086 B2 * | 4/2013 | Harada | H01L 29/861 257/77 |
| 8,536,582 B2 * | 9/2013 | Zhang | H01L 21/02433 257/77 |
| 8,569,106 B2 * | 10/2013 | Hamano | C30B 25/02 438/105 |
| 8,585,821 B2 * | 11/2013 | Nakamura | H01L 21/02529 117/101 |
| 8,715,414 B2 * | 5/2014 | Satoh | C30B 29/403 117/90 |
| 8,900,979 B2 * | 12/2014 | Sudarshan | H01L 21/02378 438/503 |
| 9,059,193 B2 * | 6/2015 | Ohtsuka | H01L 21/02496 |
| 9,793,355 B2 * | 10/2017 | Kang | H01L 29/872 |
| 9,947,782 B2 * | 4/2018 | Harada | H01L 29/7395 |
| 2001/0011745 A1 * | 8/2001 | Kushida | H01L 21/263 257/329 |
| 2005/0064723 A1 * | 3/2005 | Sumakeris | H01L 21/02529 438/757 |
| 2005/0205871 A1 * | 9/2005 | Hallin | H01L 21/0243 257/77 |
| 2006/0022292 A1 | 2/2006 | Shenoy | |
| 2006/0105559 A1 | 5/2006 | Chen et al. | |
| 2007/0290212 A1 * | 12/2007 | Mazzola | H01L 21/8213 257/77 |
| 2009/0085044 A1 * | 4/2009 | Ohno | H01L 21/02529 257/77 |
| 2009/0227098 A1 * | 9/2009 | Matsuyama | H01L 21/049 438/585 |
| 2010/0119849 A1 | 5/2010 | Nakamura et al. | |
| 2010/0133550 A1 * | 6/2010 | Zhang | C30B 23/02 257/77 |
| 2011/0031505 A1 | 2/2011 | Harada et al. | |
| 2011/0031534 A1 * | 2/2011 | Satoh | C23C 4/185 257/201 |
| 2011/0133155 A1 | 6/2011 | Yoon et al. | |
| 2011/0312161 A1 | 12/2011 | Hamano et al. | |
| 2012/0056194 A1 * | 3/2012 | Dimitrijev | H01L 21/02381 257/77 |
| 2012/0241766 A1 | 9/2012 | Ohtsuka et al. | |
| 2012/0280254 A1 | 11/2012 | Muto et al. | |
| 2013/0009171 A1 * | 1/2013 | Harada | H01L 29/045 257/77 |
| 2013/0143396 A1 * | 6/2013 | Sudarshan | C30B 25/186 438/503 |
| 2014/0117382 A1 * | 5/2014 | Kang | H01L 21/02502 257/77 |
| 2015/0295049 A1 * | 10/2015 | Kang | H01L 21/02378 257/77 |
| 2015/0311290 A1 * | 10/2015 | Kang | H01L 33/34 257/77 |

FOREIGN PATENT DOCUMENTS

| | | |
|---|---|---|
| JP | 2008-4888 A | 1/2008 |
| JP | 2008-074661 A | 4/2008 |
| JP | 2009-256138 A | 11/2009 |
| JP | 2011-233932 A | 11/2011 |
| KR | 10-2012-0099762 A | 9/2012 |

OTHER PUBLICATIONS

Search Report for International Application No. PCT/KR2013/010646.

* cited by examiner

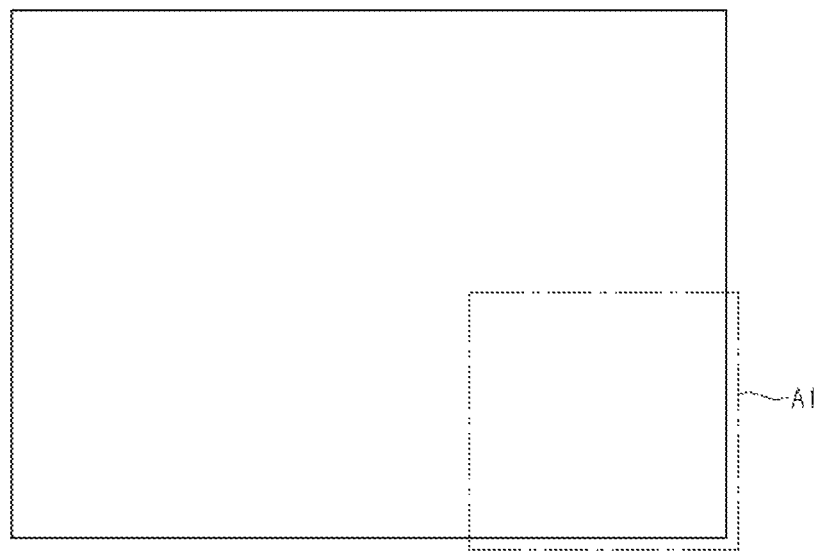
[Fig. 1A]
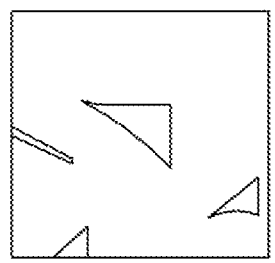 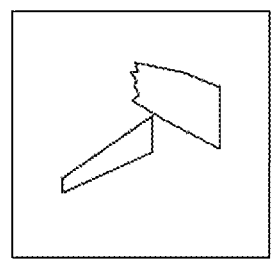
[Fig. 1B(a)]   [Fig. 1B(b)]

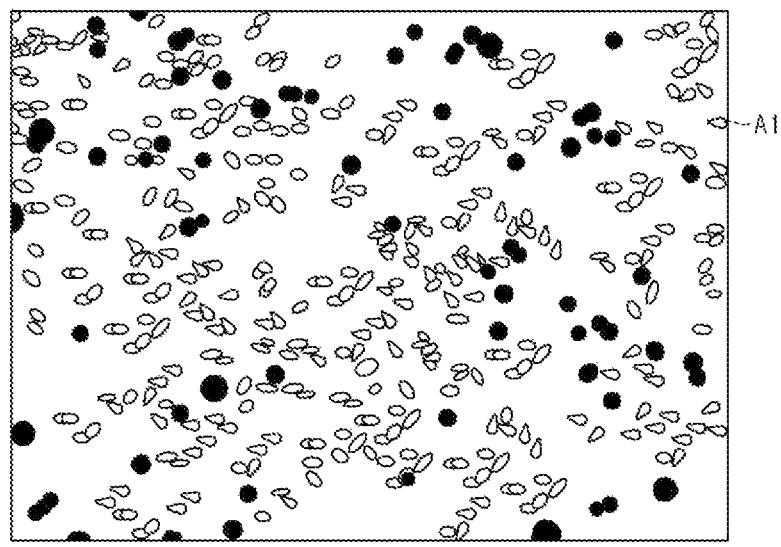
[Fig. 2A]
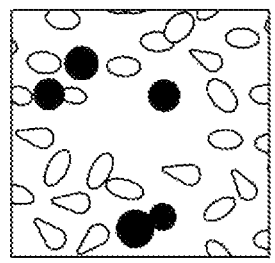
[Fig. 2B(a)]
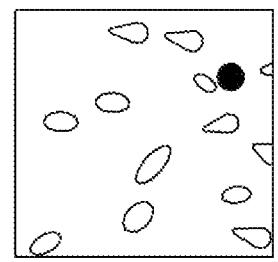
[Fig. 2B(b)]
[Fig. 3]
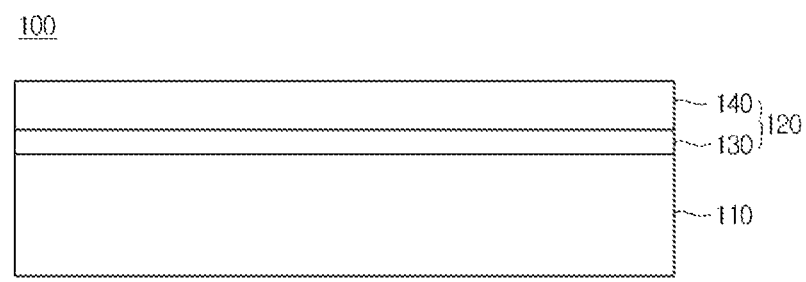

[Fig. 4]
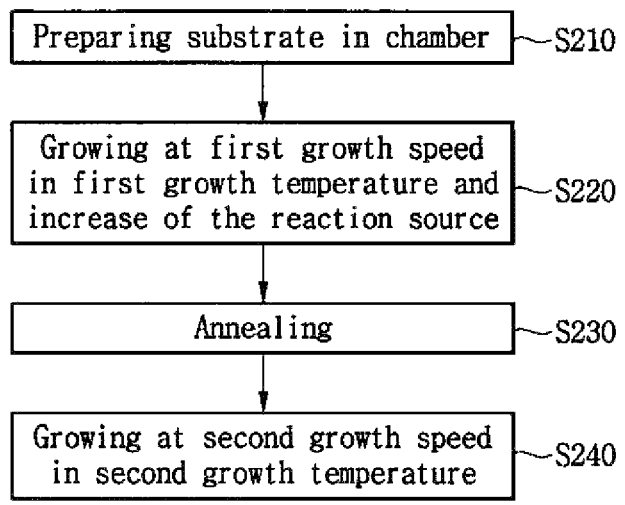

[Fig. 5]
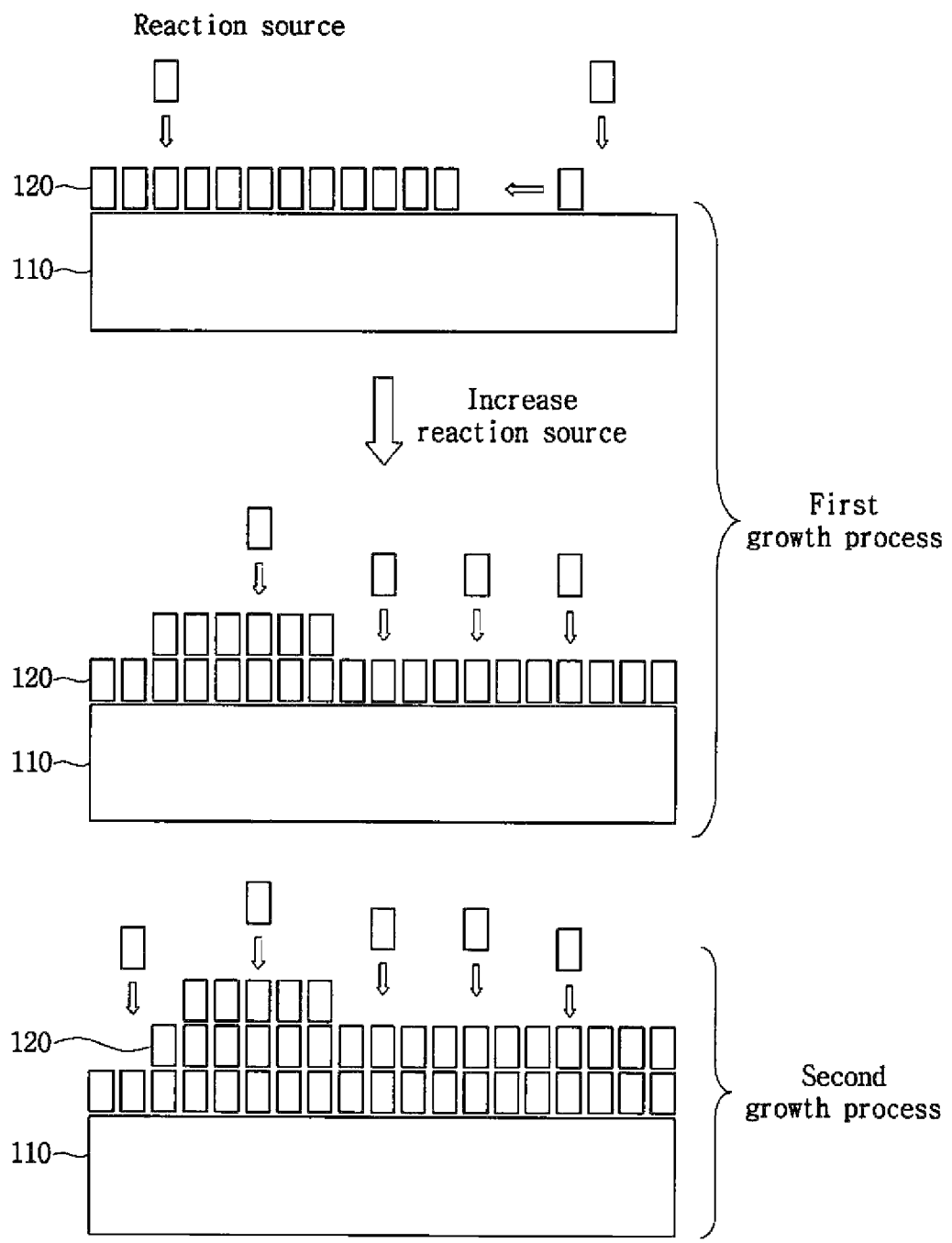

[Fig. 6]
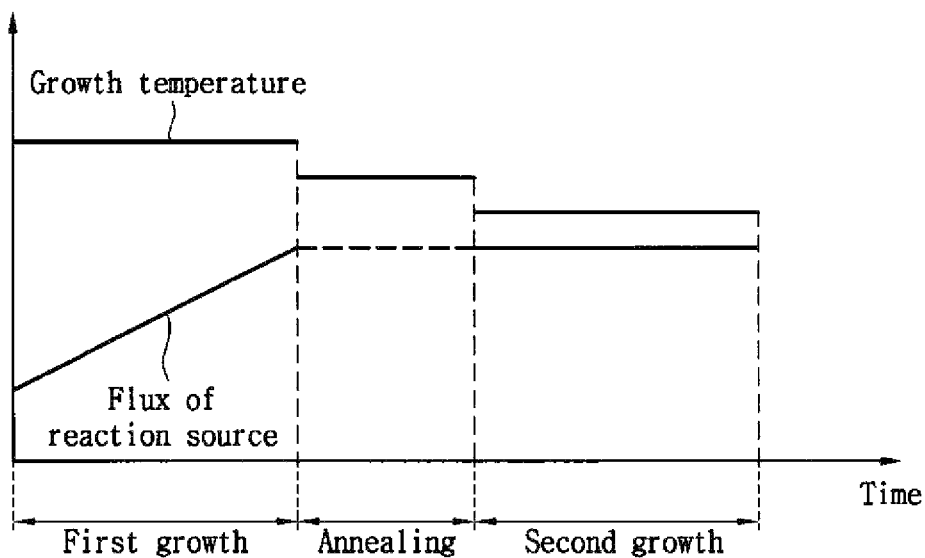
[Fig. 7]
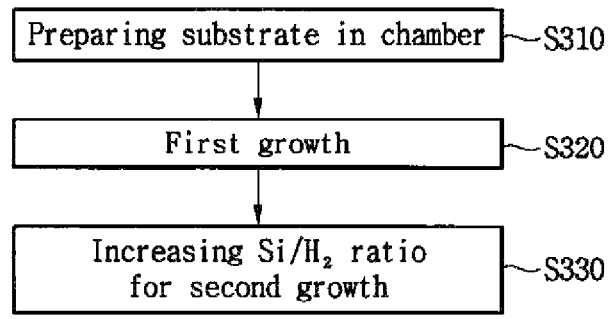

[Fig. 8]
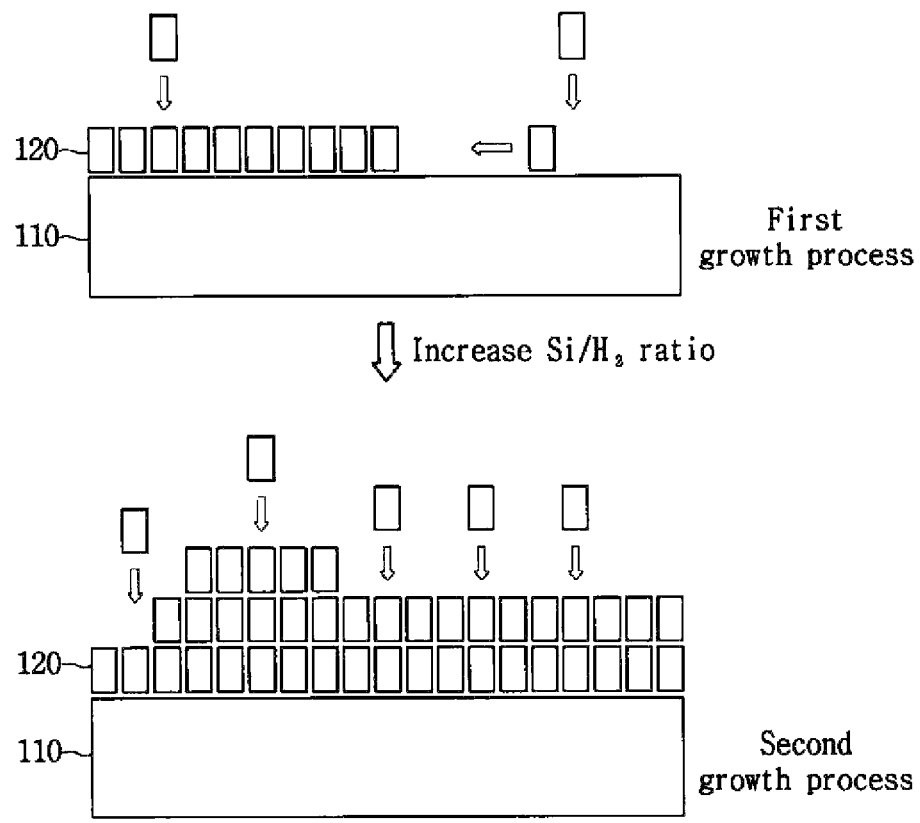
[Fig. 9]
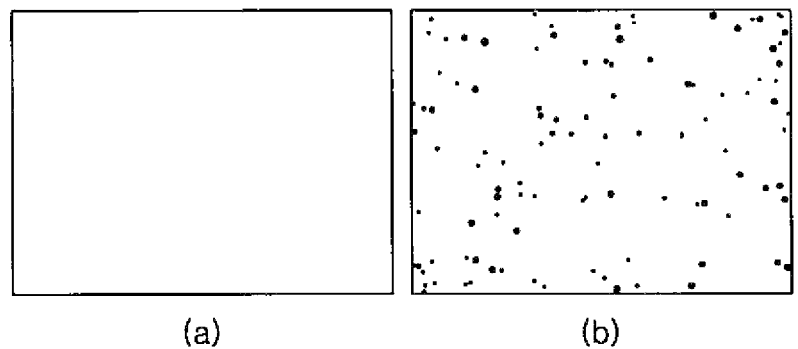
(a)  (b)

[Fig. 10]
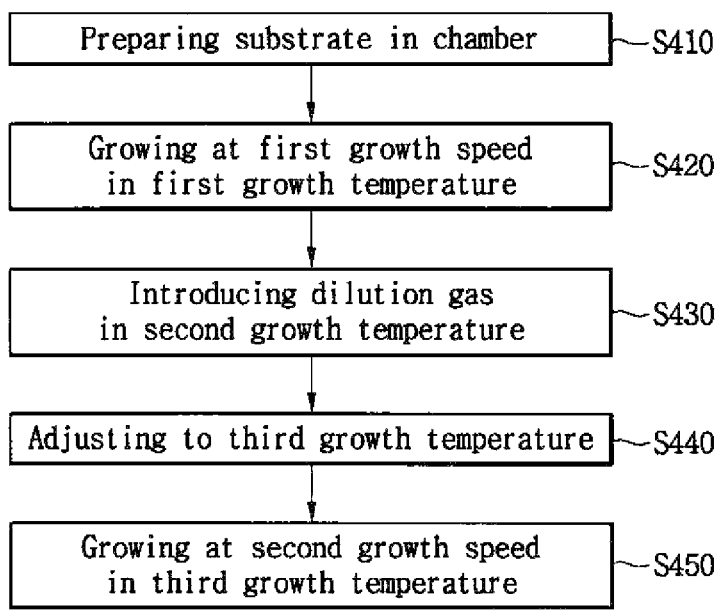
[Fig. 11]
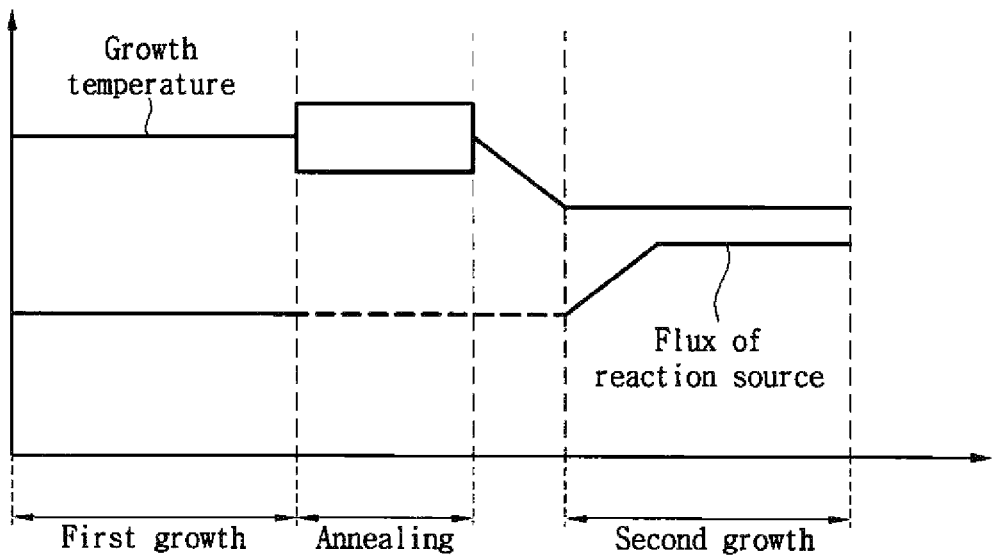

[Fig. 12]
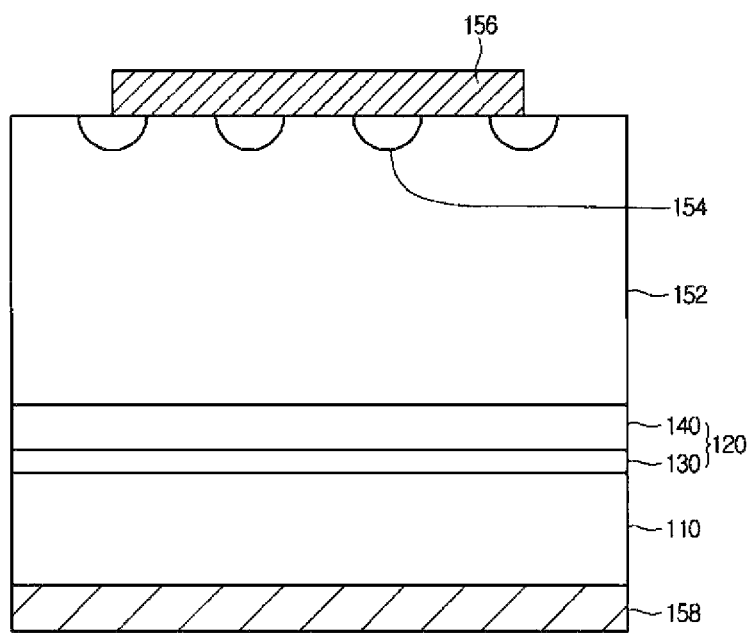

[Fig. 13]
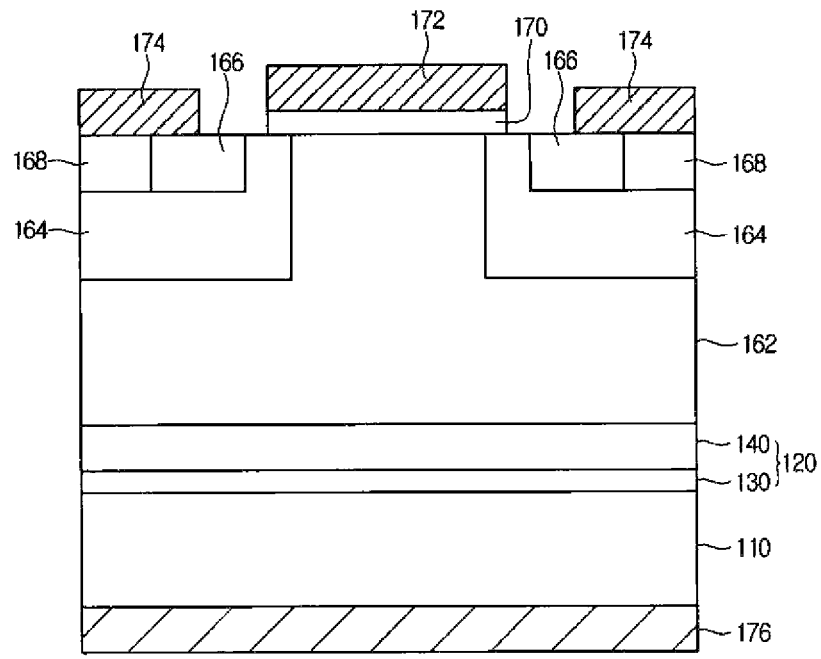
[Fig. 14]
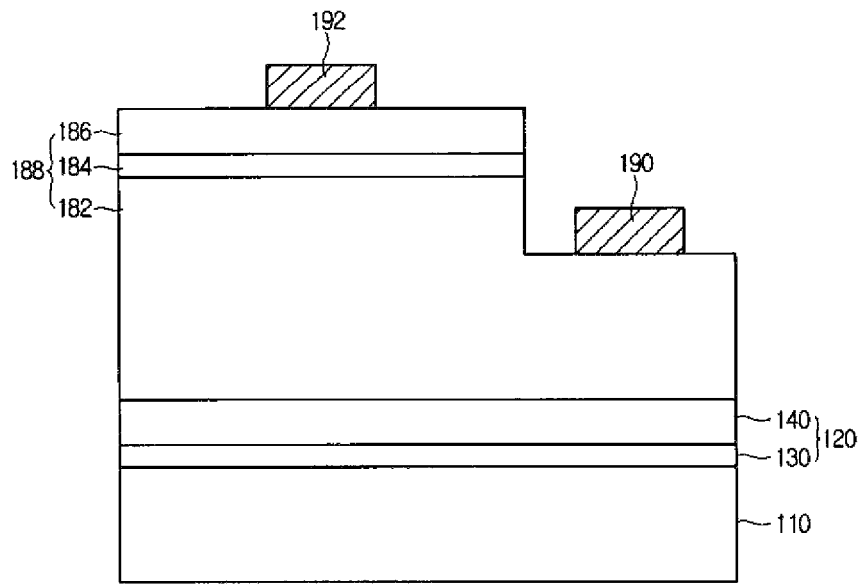

EPITAXIAL WAFER AND SWITCH ELEMENT AND LIGHT-EMITTING ELEMENT USING SAME

FIELD OF THE INVENTION

The embodiment relates to an epitaxial wafer.
The embodiment relates to a method of fabricating an epitaxial wafer.
The embodiment relates to a power element using an epitaxial wafer.
The embodiment relates to a light-emitting element using an epitaxial wafer.

BACKGROUND ART

Electronic elements have been extensively used in the society at large.
Although conventional electronic elements are fabricated using sapphire or silicon, the sapphire or the silicon does not satisfy the requirements of the electronic elements.
Recently, researches and studies have been actively performed on electronic elements based on silicon carbide.
However, the quality of a wafer, which serves as a substrate including silicon carbide, is not satisfactory.

SUMMARY OF THE INVENTION

The embodiment provides an epitaxial wafer having excellent quality.
The embodiment provides an epitaxial wafer capable of minimizing defects.
The embodiment provides a power element using the epitaxial wafer.
The embodiment provides a light-emitting element using the epitaxial wafer.

According to the embodiment, an epitaxial wafer includes: a substrate; and an epitaxial layer disposed on the substrate. The epitaxial layer includes: a first semiconductor layer disposed on the substrate; and a second semiconductor layer disposed on the first semiconductor and having a thickness that is thicker than a thickness of the first semiconductor layer. A surface defect density of the second semiconductor layer is $0.1/cm^2$ or less, According to the embodiment, a switching element includes: a substrate; a first semiconductor layer disposed on the substrate; and a second semiconductor layer disposed on the first semiconductor layer; an anode electrode disposed on the second semiconductor layer; and a cathode electrode disposed at a lower part of the substrate. At least one of the first semiconductor layer and the second semiconductor layer includes one of 3C-SiC, 4H-SiC and 6H-SiC, A surface defect density of the second semiconductor layer is $0.1/cm^2$ or less, The second semiconductor layer has a thickness that is thicker than a thickness of the first semiconductor layer.

According to the embodiment, a switching element includes: a substrate; a first semiconductor layer disposed on the substrate; a second semiconductor layer disposed on the first semiconductor layer; a source contact, a drain contact and a gate contact disposed on the second semiconductor layer; and a gate insulator disposed between the second semiconductor layer and the gate contact. At least one of the first semiconductor layer and the second semiconductor layer includes one of 3C-SiC, 4H-SiC and 6H-SiC, A surface defect density of the second semiconductor layer is $0.1/cm^2$ or less, The second semiconductor layer has a thickness that is thicker than a thickness of the first semiconductor layer.

According to the embodiment, a light-emitting element include: a substrate; an epitaxial layer on the substrate; a light emitting structure disposed on the epitaxial layer and including at least a first conductive semiconductor layer, an active layer and a second conductive semiconductor layer. The epitaxial layer includes a first semiconductor layer on the substrate, and a second semiconductor layer disposed on the first semiconductor layer. At least one of the first semiconductor layer and the second semiconductor layer includes one of 3C-SiC, 4H-SiC and 6H-SiC. A surface defect density of the second semiconductor layer is $0.1/cm^2$ or less. The second semiconductor layer has a thickness that is thicker than a thickness of the first semiconductor layer.

Advantageous Effects

The embodiment, by reducing the flux of the reaction source and initially growing the epitaxial material at a slow speed, can minimize internal defects and surface defects of the epitaxial layer.
The embodiment, by reducing the amount of Si and initially growing the epitaxial material at a slow speed, can minimize internal defects and surface defects of the epitaxial layer.
The embodiment, by reducing the flux of the growth source and the doping source and initially growing the epitaxial material at a slow speed, can minimize internal defects and surface defects of the epitaxial layer.
Accordingly, the embodiment employs the epitaxial wafer in which the internal detects and the surface defects are minimized to the electronic element, thus satisfying the characteristics required by the corresponding electronic element.

BRIEF DESCRIPTION OF THE DRAWINGS

FIGS. 1A, 1B(a) and 1B(b) are views explaining a surface defect that is generated in an epitaxial growth process.
FIGS. 2A, 2B(a) and 2B(b) are views showing an epitaxial wafer after being etched to identify the surface defect.
FIG. 3 is a sectional view showing the epitaxial wafer according to the embodiment.
FIG. 4 is a flow chart showing a fabricating process of the epitaxial wafer of FIG. 3 according to the first embodiment.
FIG. 5 is a view explaining the fabricating process of FIG. 4.
FIG. 6 is a view showing a reaction source and a change in a growth temperature according to an epitaxial growth.
FIG. 7 is a flow chart showing a fabricating process of the epitaxial wafer according to the second embodiment.
FIG. 8 is a view explaining the fabricating process of FIG. 7.
FIG. 9 is a view showing a surface of the epitaxial wafer fabricated by the fabricating process of FIG. 7.
FIG. 10 is a flow chart showing a fabricating process of the epitaxial wafer according to the third embodiment.
FIG. 11 is a view showing the reaction source and the change in the growth temperature according to the epitaxial growth.
FIG. 12 is a sectional view showing a Schottky barrier diode according to the embodiment.
FIG. 13 is a sectional view showing a MESFET according to the embodiment.
FIG. 14 is a sectional view showing a light-emitting element according to the embodiment.

DETAILED DESCRIPTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern. Such a position of the layer has been described with reference to the drawings.

Hereinafter, embodiments will be described with reference to accompanying drawings. Thicknesses and sizes of each layer in the drawings are exaggerated, omitted, or simplified for convenience and clarity of description. In addition, sizes of each component do not completely reflect the actual size.

A semiconductor based electronic element may be formed by an additional structure on an epitaxial wafer. Therefore, to fabricate the semiconductor based electronic element having excellent quality, the quality of the epitaxial wafer should be guaranteed.

The epitaxial wafer of the embodiment optimizes a growth process condition to minimize internal defects and surface defects thereby guaranteeing quality. Thus, the quality of the semiconductor based electronic element may be improved by the epitaxial wafer.

A switch element for controlling switching and a light-emitting element for generating light may be used for the electronic element of the embodiment. A power element may include a power element such as a Schottky barrier diode and a MESFET (Metal Semiconductor Field Effect Transistor), but is not limited thereto.

FIGS. 1 and 2 are views explaining a surface defect that is generated on a surface of an epitaxial wafer. FIG. 1 is a view explaining a surface defect that is generated in an epitaxial growth process, and FIG. 2 is a view showing the epitaxial wafer after etching to identify the surface defect.

FIG. 1A shows an example of an optical surface image of the epitaxial wafer on which an epitaxial is grown, and FIGS. 1B(a) and 1B(b) show surface defects that generate in an epitaxial growth process.

Referring to FIG. 1, the surface defects of the epitaxial wafer may be generated due to internal defects such as a Basal Plane Dislocation (BPD), Stacking Faults (SFs), a Frank Partial Dislocation (FPD), etc. occurring in the epitaxial growth process.

FIG. 2A is a view showing the epitaxial wafer of FIG. 1A after etching, in which area A1 of FIG. 1A is enlarged. FIGS. 2B(a) and 2B(b) are enlarged views showing defects that generate on the surface of the epitaxial wafer after etching.

Referring to FIG. 2, when potassium hydroxide (KOH) is added to the epitaxial wafer, the surface of the epitaxial wafer, to which dislocation, such as the BPD or the FPD, is connected, may be etched faster than other surfaces. Therefore, the surface of the epitaxial wafer, to which the dislocation is connected, may create an etch pit. An etch pit density (EPD), which is the number of etch pits, may be used as a parameter for evaluating the quality of a wafer.

FIG. 3 is a sectional view showing an epitaxial wafer according to an embodiment.

Referring to FIG. 3, an epitaxial wafer 100 according to the embodiment may include a substrate 110 and an epitaxial layer 120.

The substrate 110 may include silicon carbide. In other words, the substrate 110 may include any one of 3C-SiC, 4H-SiC and 6H-SiC.

Silicon carbide may be a compound semiconductor including silicon (Si) and carbon (C). Compared to typical silicon (Si), silicon carbide has 10 times the dielectric breakdown field strength, 3 times the bandgap and 3 times the thermal conductivity.

Due to the excellent characteristics, silicon carbide is expected to be widely utilized in electronic elements. Silicon carbide may be employed in power elements or light-emitting elements. Specifically, the power elements based on silicon carbide may withstand high breakdown voltages, have low resistivity and be operated in high temperatures.

Due to the high breakdown voltage, a very thin drift layer is formed so the thickness of the power element may be significantly reduced.

An epitaxial material may be grown on the substrate 110 to form the epitaxial layer 120.

The epitaxial layer 120 may be grown by using HVPE (Hydride Vapor Phase Epitaxy), MOCVD (Metal Organic Chemical Vapor Deposition), MBE (Molecular Beam Epitaxy) or sputtering.

The epitaxial material may include a compound semiconductor that is same as the substrate 110, for example silicon carbide, but the embodiment is not limited thereto.

Since the epitaxial layer 120 includes the same material as the substrate 110, a lattice constant difference or a thermal expansivity difference between the epitaxial layer 120 and the substrate 110 does not occur so defects such as bending due to stress do not occur.

In addition, because the epitaxial layer 120 is grown by a material that is same as the material of the substrate 110, the Crystalline of the epitaxial layer 120 may be improved.

The epitaxial layer 120 according to the embodiment may include a first semiconductor layer 130 and a second semiconductor layer 140. The first and second semiconductor layers 130 and 140 may include same compound semiconductor materials, for example silicon carbide.

The second semiconductor layer 140 may be an active layer for performing specific functions of the electronic element, but is not limited thereto. For example, the second semiconductor layer 140 may be a drift layer of the power element.

The first semiconductor layer 130 may be a buffer layer to lessen or minimize the defects that occur in the second semiconductor layer 140. The defects may be an internal defect that occur in the first and second semiconductor layers 130 and 140 or a surface defect that occur on an upper surface of the second semiconductor layer 140.

The types of the surface defects include droplets, triangle defects, pits, wavy pits, particles, etc.

Because the second semiconductor layer 140 is grown on the first semiconductor layer 130, the defects generated in the first semiconductor layer 130 should be minimized to minimize the defects generated on the second semiconductor layer 140.

To this end, the first semiconductor layer 130 and the second semiconductor layer 140 may be grown in process conditions different from each other. For example, a first process condition may be set for the first semiconductor layer 130 such that the growth speed is reduced while minimizing the defects, and a second process condition may be set for the second semiconductor layer 140 to increase the growth speed.

By this process, the internal detects of the epitaxial layer 120 of the embodiment, specifically, the density of the BPD may be $0.1/cm^2$ or less, and the surface defect concentration of the epitaxial layer 120 may be $0.1/cm^2$ or less.

In the embodiment, the size, by which the defect is determined, is few μm to tens of μm. Thus, the defects having sizes smaller than this size are excluded from being determined as defects.

The epitaxial layer 120 may be named as an epitaxial structure, an epitaxial film or a semiconductor structure.

Hereinafter, a fabricating process of the epitaxial wafer 100 according to the embodiment is described.

The surface defect concentration of the epitaxial wafer 100 may change due to variables such as a flux of a reaction source initially inserted, a growth temperature, a pressure, a flux of an entire reaction source, a carbon/silicon (C/Si) ratio, a silicon/hydrogen (Si/H$_2$) ratio, etc.

In the following first, second and third embodiments, methods for reducing the surface defect concentration to 0.1/cm$^2$ or less are provided. To this end, a method for suppressing the internal defects of the epitaxial wafer 100 such as BPD, SFs, FPD, etc. may be used. In addition, in the first, second and third embodiments, a method for controlling an initial growth condition to suppress internal defects may be provided.

First Embodiment

FIG. 4 is a flow chart showing a fabricating process of an epitaxial wafer 100 of FIG. 3 according to the first embodiment. FIG. 5 is a view explaining the fabricating process of FIG. 4.

Referring to FIGS. 4 and 5, the substrate 110 may be provided in a reaction chamber (S210).

The substrate 110 may include one of 3C-SiC, 4H-SiC and 6H-SiC.

Before the substrate 110 is loaded in the reaction chamber, a cleaning process may be performed to remove an oxide layer that is naturally generated on the surface of the substrate.

The substrate 110 may, for example have an off angle of approximately 0° to 10°, but is not limited thereto. The off angle may be defined as an inclined angle of the substrate 100 with respect to a (0001)Si surface and a (000-1)C surface.

When the substrate 110 is provided, the reaction source for the epitaxial growth may be introduced into the reaction chamber.

The reaction source may include a growth source for epitaxial growth, a doping source for doping and a dilution gas, but the embodiment is not limited thereto.

The growth source may differ according to the material and the type of the substrate 110. For example, when the substrate 110 includes silicon carbide, solid, liquefied or gasified material, such as SiH$_4$+C$_3$H$_8$+H$_2$, MTS(CH$_3$SiCl$_3$), TCS(SiHCl$_3$), or SixCx, including carbon and silicon, and having a lattice constant equal to or approximate to that of the substrate 110 may serve as the growth source.

The doping source may include a group V compound semiconductor material including a nitrogen gas (N$_2$) for N type doping, or a group III compound semiconductor material including Al for P type doping.

For example, a p-type aluminum silicon carbide (AlSiC) semiconductor layer may be grown by the growth process that uses the growth source including silicon carbide, the doping source including Al and the dilution gas.

For example, an n-type silicon carbide nitride (SiCN) semiconductor layer may be grown by the growth process that uses the growth source including silicon carbide, the doping source including nitrogen gas (N2) and the dilution gas.

The p-type aluminum silicon carbide (AlSiC) semiconductor layer or the n-type silicon carbide nitride (SiCN) semiconductor layer may be a conductive semiconductor layer, but the embodiment is not limited thereto.

The dilution gas plays the role of diluting the growth source or the doping source. The dilution gas may include hydrogen gas (H$_2$), or inert gas such as argon (Ar) or helium (Hg), but the embodiment is not limited thereto.

The first semiconductor layer 130 may be grown on the substrate 110 by using a first growth process (S220).

In the first growth process, the growth temperature (hereinafter, called the first growth temperature) may be approximately 1600° C. to approximately 1700° C., the pressure is approximately 50 mbar to approximately 150 mbar, the C/Si ratio is approximately 0.4 to approximately 1.7, the Si/H$_2$ ratio is approximately 1/1000 to 1/200. In detail, the growth temperature is approximately 1600° C. to approximately 1640° C., the pressure is approximately 80 mbar to approximately 110 mbar, the C/Si ratio is approximately 0.7 to approximately 1.5, the Si/H$_2$ ratio is approximately 1/800 to 1/400.

The first semiconductor layer 130 may be grown at a first growth speed by a first growth process. The first growth speed may be lower than a second growth speed for growing the second semiconductor layer 140, which will be described below. For example, the first growth speed may be set approximately 1 μm/h to approximately 3 μm/h, but the embodiment is not limited thereto.

By lowering the flux of the reaction source, the growth speed may be lowered to the first growth speed, but the embodiment is not limited thereto.

The density of the BPD, which is an internal defect, may have a positive proportional relationship with the reaction source. In other words, as the flux of the reaction source is reduced, the density of the BPD may be reduced, but the embodiment is not limited thereto.

The first growth process may be maintained for 30 seconds to 3 minutes, and preferably for 2 minutes to 3 minutes.

The reaction source in the first growth process may increase from approximately 1/4000 to approximately 1/3000 to approximately 1/800 to approximately 1/600 with respect to the amount of the dilution gas.

The flux of the reaction source may be increased linearly, non-linearly or in a stepwise fashion.

In general, when the epitaxial growth is performed at a high growth temperature on the substrate, atoms of the growth source possess high energy, thus the mobility between the atoms are active. Therefore, when semiconductor layer is grown at high speeds while maintaining the high growth temperature, a uniform growth may be difficult.

In the first growth process of the first embodiment, by maintaining the high growth temperature, the mobility between the atoms by the reaction source is made active and the growth speed is reduced so the atoms may be uniformly distributed and grown on the substrate 110. In addition, by increasing the flux of the reaction source, more atoms of the reaction source are laminated on the substrate 110, so the first semiconductor layer 130 may be more uniformly grown and have excellent Crystalline.

Therefore, the internal defect of the first semiconductor layer 130 that is grown by the first growth process may be significantly reduced. For example, the density of the BPD of the first semiconductor layer of the first embodiment may be 0.1/cm$^2$ or less.

An annealing process may be performed for stabilizing a lattice in the first semiconductor layer 130 (S230). During the annealing process, the reaction gas may not be introduced and the dilution gas may be introduced, but the embodiment is not limited thereto. Therefore, during the annealing process, the epitaxial growth is not progressed any further, and the lattice stabilization in the first semiconductor layer 130 may be performed.

The annealing process may be performed for approximately 5 minutes to 1 hour. In detail, the annealing process may be performed for approximately 5 minutes to 30 minutes. The annealing temperature may be lower than the temperature of the first growth process, but the embodiment is not limited thereto.

The duration of the annealing may differ according to the C/Si ratio used in the first growth process.

The second semiconductor layer 140 may be grown on the first semiconductor layer 130 by using a second growth process S240.

After the first semiconductor layer 130, which may minimize the internal defect by the first growth process, is grown, the second semiconductor layer 140 by the second growth process may be quickly grown so that the process time is reduced.

In the second growth process, the growth temperature (in other words, a second growth temperature) may be approximately 1500° C. to approximately 1700° C., the pressure may be approximately 80 mbar to approximately 110 mbar, C/Si ratio may be approximately 1, Si/H2 ratio may be approximately 1/800 to approximately 1/400. In addition, the flux of the reaction source may be approximately 1/800 to approximately 1/600.

The second semiconductor layer 140 may be grown at the second growth speed by the second growth process. The second growth speed may be higher than the first growth speed of the first semiconductor layer 130. For example, the second growth speed may be approximately 20 µm/h or higher. In detail, the second growth speed may be approximately 20 µm/h to 30 µm/h. When the semiconductor layer is grown at a speed higher than 30 µm/h, the Crystalline of the second semiconductor layer 140 may degrade and the surface roughness may increase.

The second semiconductor layer 140 is for increasing the growth speed, and may have a thickness that is thicker than the thickness of the first semiconductor layer, but the embodiment is not limited thereto. In addition, the second semiconductor layer 140 may be used as an active layer for performing a specific function, for example, a function of a drift layer of the switch element or a function of a first conductive semiconductor layer of the light-emitting element, but the embodiment is not limited thereto.

The second growth speed of the second growth process may be made higher that the first growth speed of the first growth process, so the slow growth speed in the first growth process is compensated for, thereby reducing the process time by quickly growing to a desired thickness of the second semiconductor layer 140, in other words to a target thickness. The target thickness may differ according to an application purpose, usage, final element, a character of a product, a design factor, etc.

As shown in FIG. 6, the growth temperature of the first growth process may be set higher than the growth temperature of the second growth process to increase the amount of the reaction gas, so that the first semiconductor layer 130 having the internal defect of $0.1/cm^2$ or less is grown. The array of the lattice structure of the first semiconductor layer 130 may be stabilized by the annealing process, and the growth speed in the second growth process is increased to a speed higher than the speed in the first growth process so that the second semiconductor layer 140 having a desired thickness may be quickly grown.

Therefore, according to the first embodiment, the first growth process is used to slowly grow the first semiconductor layer 130, and the second growth process is used to quickly grow the second semiconductor layer 140, so that the internal defect of the epitaxial wafer 100, in other words, the density of the BPD and the surface defect density may each be reduced to $0.1/cm^2$ or less.

By the growth process, the epitaxial layer 120 including the first semiconductor layer 130 and the second semiconductor layer 140 may be grown on the substrate 110 to fabricate the epitaxial wafer 100 as shown in FIG. 3.

Accordingly, the density of the reaction source of the grown first semiconductor layer 130 may be lower than the density of the reaction source of the second semiconductor layer 140. This may be due to using less flux of the reaction source to grow the first semiconductor layer 130 compared to the reaction source used to grow the second semiconductor layer 140. In this case, the reaction source may be the growth source including a compound material constituted by silicon carbide. In addition, the reaction source may be the growth source and the doping source, which are constituted by silicon carbide.

EMBODIMENT

After the flux of the reaction source is increased from 1/4000 of H2 gas to 1/700 of H2 gas for 3 minutes at the growth temperature of 1700° C., the pressure of 90 mbar, the C/Si ratio of 1.0, the Si/H2 ratio of 1/600 during the first growth process, during the second growth process, the flux of the reaction source is maintained at 1/700 of H2 gas at the growth temperature of 1600° C., the pressure of 90 mbar, the C/Si ratio of 1.0, the $Si/H_2$ ratio of 1/600 to obtain the epitaxial wafer 100 having the density of the BPD of $0.1/cm^2$ or less.

COMPARISON EXAMPLE

After the flux of the reaction source is maintained at 1/4000 of $H_2$ gas for 3 minutes at the growth temperature of 1700° C., the pressure of 90 mbar, the C/Si ratio of 1.0, the $Si/H_2$ ratio of 1/700 during the first growth process, during the second growth process, the flux of the reaction source is maintained at 1/700 of $H_2$ gas at the growth temperature of 1600° C., the pressure of 90 mbar, the C/Si ratio of 1.0, the $Si/H_2$ ratio of 1/600, and as a result, the epitaxial wafer having the density of the BPD higher than $0.1/cm^2$ was obtained.

Second Embodiment

FIG. 7 is a flow chart showing a fabricating process of an epitaxial wafer according to a second embodiment, and FIG. 8 is a view explaining the fabricating process of FIG. 7.

Descriptions overlapping with the first embodiment are omitted in the second embodiment.

Referring to FIGS. 7 and 8, the substrate 110 may be provided in the reaction chamber (S310).

After the reaction source is introduced, the first semiconductor layer 130 may be grown by using the first growth process (S320).

In general, when the epitaxial growth is performed at a high growth speed on the substrate, there is insufficient time for the atoms of the epitaxial material to be uniformly distributed on the substrate, thereby rapidly increasing the internal defects. Specifically, a threading edge dislocation (TED) may rapidly increase.

In the first growth process of the embodiment, the epitaxial growth speed may be reduced so that the atoms of the epitaxial material may be uniformly distributed and grown on the substrate 110. Therefore, the internal defect in the first semiconductor layer 130 may be minimized, thereby ultimately minimizing the surface defect of the second semiconductor layer 140, which is grown after the first semiconductor layer.

The $Si/H_2$ ratio may be set at low to slowly grow the first semiconductor layer 130 in the first growth process. For example, the $Si/H_2$ ratio may be approximately 1/12000 to 1/2000. In other words, by reducing the amount of Si, the first semiconductor layer 130 may be slowly grown.

In the first growth process, the process conditions apart from the $Si/H_2$ ratio may be identical to the first embodiment, but the embodiment is not limited thereto.

The second semiconductor layer 140 may be grown by using the second growth process while continuously introducing the reaction source (S330).

In the second growth process, by making the $Si/H_2$ ratio higher that in the first growth process, the growth speed in the second growth process may be increased.

The $Si/H_2$ ratio may be controlled such that the $Si/H_2$ ratio is gradually increased. The $Si/H_2$ ratio may be increased linearly, non-linearly or in a stepwise fashion. For example, the $Si/H_2$ ratio may be increased from 1/12000 to 1/2000 in the first growth step to 1/2000 to 1/300, but the embodiment is not limited thereto. The $Si/H_2$ ratio may be controlled by controlling the introduction flux of the growth source. In other words, the $Si/H_2$ ratio may be increased by gradually increasing the introduction flux of the growth source.

In the second growth process, the second semiconductor layer 140 may be grown to the target thickness while the $Si/H_2$ ratio is maintained between 1/2000 and 1/300.

According to the second embodiment, in the first growth process, the $Si/H_2$ ratio is made low to slowly grow the first semiconductor layer 130 so that the internal defect of the first semiconductor layer 130 is minimized. For example, the BPD (Basal Plane Dislocation) may be transformed to the TED (Thread Edge Dislocation) or the TSD (Threading Screw Dislocation) by the slow growth in the first growth process. Therefore, the number of the BPD may significantly be reduced. For example, the density of the BPD of the first semiconductor layer 130 grown by the second embodiment may be $0.1/cm^2$ or less.

The TED and the TSD, which are crystal defects, may also be significantly reduced. Specifically, the FPD may be completely removed. Therefore, 99.5% to 100% of the internal defects generated in a typical epitaxial layer 120 may be removed.

Since the second semiconductor layer 140 is formed on the first semiconductor layer 130, in which the internal defect is minimized, the surface defect of the second semiconductor layer 140 may be reduced to $0.1/cm^2$ or less.

Since the internal defect of the first semiconductor layer 130 is reduced, the EPD (Etch Pit Density) generated by the internal dislocation in the first semiconductor layer 130 may also be significantly reduce to $0.1/cm^2$ or less. In addition, the BPD (Basal Plane Dislocation) of the first semiconductor layer 130 may be from 0 to $30/cm^2$. Therefore, reducing the BPD/EPD ratio to 0.01 or less is also possible.

FIG. 9 is a view showing a surface of the epitaxial wafer fabricated by the fabricating process of FIG. 7. FIG. 9 (a) and (b) show images before and after KOH etching of the epitaxial wafer, respectively.

As shown in FIG. 9, defects occurring on the surface after the etching process are significantly reduced compared to FIG. 2.

By the growth process, the epitaxial layer 120 including the first semiconductor layer 130 and the second semiconductor layer 140 may be formed on the substrate 110 to fabricate the epitaxial wafer 100 as shown in FIG. 3.

Accordingly, the density of silicon of the grown first semiconductor layer 130 may be lower than the density of silicon of the second semiconductor layer 140. This may be due to using less amount of silicon to grow the first semiconductor layer 130 compared to the silicon used to grow the second semiconductor layer 140.

Third Embodiment

FIG. 10 is a flow chart showing a fabricating process of an epitaxial wafer according to a third embodiment.

Descriptions overlapping with the first embodiment are omitted in the second embodiment.

Referring to FIG. 10, the substrate 110 may be provided in the reaction chamber (S410).

After the reaction source is introduced, the first semiconductor layer 130 may be grown by using the first growth process (S420). In other words, the first semiconductor layer 130 may be grown at a first growth speed by a first growth temperature.

The first growth temperature may be approximately 1600° C. to approximately 1700° C. as in the first embodiment, but the embodiment is not limited thereto. For example, the first growth speed may be approximately 1 μm/h to 3 μm/h.

The first semiconductor layer 130 may be grown to have a first growth thickness. For example, the first growth thickness may be approximately 0.5 μm to approximately 1 μm, but the embodiment is not limited thereto.

In the first growth process, the C/Si ration is approximately 0.7 to approximately 0.8, the $Si/H_2$ ratio is approximately 0.03 or less, an introduction parameter of the reaction source may be controlled between approximately 1.5 ml/min and 4.0 ml/min.

The introduction parameter of the reaction source may be defined as equation 1 below.

$$\text{Introduction parameter} = \frac{(a1 * \text{flux of growth source} \div b1)}{((a2 * \text{flux of doping source} \div b2) * (a3 * \text{flux of doping source}) \div (a4 * \text{amount of dilution gas}) \div b3)} \quad \text{Equation 1}$$

In this case, a1 to a4 are positive real numbers, b1 to b3 are real numbers, the flux of the growth source, the amount of the doping gas and the amount of the dilution gas have a unit of ml/min.

For example, a1=a2=a3=a4=1 and b1=b2=b3=0.

In this case, the growth source, the doping gas and the dilution gas may be introduced to satisfy an introduction parameter of approximately 1/4 min/ml to approximately 1/1.5 min/ml, in other words, approximately 1.5 ml/min to approximately 4.0 ml/min according to equation 1.

Accordingly, the first semiconductor layer 130 having the doping density of approximately $5 \times 10^{17}/cm^3$ to approximately $7 \times 10^{18}/cm^3$ may be grown.

The second growth process may be performed. In other words, the growth temperature may be controlled to be lower or higher than the growth temperature in the first growth process and the dilution gas ($H_2$) may be introduced into the reaction chamber (S430). For example, the second growth temperature may be set 10° C. to 300° C. lower or 10° C. to 300° C. higher than the first growth temperature.

The second growth process may be the annealing process. Therefore, during the annealing process, the epitaxial growth is not progressed any further, and the lattice stabilization in the first semiconductor layer 130 may be performed. In addition, a dopant, which is positioned as an intruder type in the first semiconductor layer 130, is transformed as a substitution type, to perform functions of the dopant.

The annealing process may be performed for approximately 5 minutes to 1 hour. In detail, the annealing process may be performed for approximately 5 minutes to 30 minutes. The annealing temperature may be lower than the temperature of the first growth process, but the embodiment is not limited thereto.

Then, the third growth process may be performed. The second growth temperature may be controlled to a third growth temperature by continuously introducing the dilution gas ($H_2$) in the reaction chamber (S440).

In the second and third growth processes, the reaction may be introduced and the dilution gas may not be introduced. Therefore, in the second and third growth processes, the first semiconductor layer 130 is not further grown.

Meanwhile, the third growth temperature is for growing the second semiconductor layer 140, for example, may be 1500° C. to 1700° C.

The first growth temperature may be set 10° C. to 300° C. higher than the third growth temperature. As described above, since the second growth temperature may be set 10° C. to 300° C. lower or higher than the first growth temperature, the second and third growth temperatures may be identical, but the embodiment is not limited thereto.

When the second growth temperature is set higher than the third growth temperature, the growth temperature may be lowered from the second growth temperature to the third growth temperature in the third growth process.

Accordingly, a fourth growth process may be performed in the third growth temperature. In other words, the second semiconductor layer 140 may be grown at the second growth speed in the third growth temperature by the second growth process (S450).

In detail, after the reaction source is introduced in the third growth temperature, the amount may be gradually increased. Accordingly, the second semiconductor layer 140 may be grown to the second growth thickness at the second growth speed while the flux of the reaction source is increased.

The second growth speed may be set higher than the first growth speed in the first growth process. For example, the second growth speed may set to approximately 20 μm/h or higher. In detail, the second growth speed may be from approximately 20 μm/h to approximately 30 μm/h.

The first and second growth speeds may be controlled according to the flux of the growth source and/or the doping source in the reaction source.

Even though the doping concentration of the first semiconductor layer 130 is higher than the doping concentration of the second semiconductor layer 140, the growth speed (the second growth speed) of the second semiconductor layer 140 may be set significantly higher than the growth speed (the first growth speed) of the first semiconductor layer 130.

Therefore, the flux of the growth source may be more in the second growth process than the first growth process. The flux of the growth source may be increased linearly, non-linearly or in a stepwise fashion. The flux of the growth source introduced for growing the second semiconductor layer 140 is significantly more than the growth source introduced for growing the first semiconductor layer 130.

In addition, the flux of the doping source may be set to increase from the flux of the doping source satisfying the doping concentration of the first semiconductor layer 130 to the flux of the doping source satisfying the doping concentration of the second semiconductor layer 140.

Therefore, not only the flux of the growth source, but also the flux of the doping source may be set to be more than in the first growth process.

The flux of the doping gas may be increased, for example, from 0.1 ml/min to 0.5 ml/min in the first growth process to 1.5 ml/min to 2.5 ml/min.

As the flux of the growth source and/or the doping source are increased in the fourth growth process, the second semiconductor layer 140 may be grown at a high speed, by contrast, since the flux of the growth source and/or the doping source in the first growth process is less than the flux of the growth source and/or the doping source in the fourth growth process, the first semiconductor layer 130 may be grown at a low speed.

As shown in FIG. 11, by making the first growth speed low through making the growth temperature high and the flux of the reaction source low, the epitaxial material laminated on the substrate 110 is uniformly distributed and grown so that the internal defect of the first semiconductor layer 130 may be minimized.

Because the internal defect in the first semiconductor layer 130 is minimized, the internal defect in the second semiconductor layer 140 that is grown on the first semiconductor layer 130 may also be minimized. This is due the internal defect influencing between the layers. In other words, when the internal defect is minimized in the lower layer, the internal defect in the upper layer, which is grown on the lower layer, may also be minimized.

In addition, the growth time of the second semiconductor layer 140 may be reduced by increasing the second growth speed through making the flux of the reaction source of the fourth growth process high, and even when the growth speed of the second semiconductor layer 140 increased, the internal defect of the second semiconductor layer 140 may be similar to or a little more than the first semiconductor layer 130.

The uniformity (standard deviation/average) of the thickness of the second semiconductor layer 140 grown by the process may be 0.005, in other words, 0.5% or less.

In addition, each of the density of the BPD of the first semiconductor layer 130 and the surface defect density of the second semiconductor layer 140 may be 0.1/cm$^3$ or less.

Furthermore, because the atom of the doping source is stably positioned in the first semiconductor layer 130 by the second growth process (annealing process, the quality of the epitaxial wafer 100 is further improved.

The epitaxial layer 120 may be formed by the first semiconductor layer 130 and the second semiconductor layer 140.

By making the doping concentration of the first semiconductor layer 130 higher than the doping concentration of the second semiconductor layer 140, the crystal defect due to a lattice constant disagreement between the substrate 110 and the second semiconductor layer 140 may be reduced. For example, the doping concentration of the first semiconductor layer 130 may be 5×10$^{17}$/cm$^3$ to 7×10$^{18}$/cm$^3$, and the doping concentration of the second semiconductor layer 140 may be 1×10$^{15}$/cm3 to 5×10$^{15}$/cm3.

On the whole, the doping uniformity (standard deviation/average) of the epitaxial layer 120 may be 0.1, in other words, 10% or less.

The uniformity (standard deviation/average) of the thickness of the second semiconductor layer 140 may be fabricated to be 0.005, in other words, 0.5% or less, and the surface roughness of the second semiconductor layer 140 may be fabricated to be 1 nm or less.

By the growth process, the epitaxial layer 120 including the first semiconductor layer 130 and the second semiconductor layer 140 may be formed on the substrate 110 to fabricate the epitaxial wafer 100 as shown in FIG. 3.

Accordingly, the density of the reaction source of the grown first semiconductor layer 130 may be lower than the density of the reaction source of the second semiconductor layer 140. This may be due to using less flux of the reaction source to grow the first semiconductor layer 130 compared to the reaction source used to grow the second semiconductor layer 140. In this case, the reaction source may be the growth source including a compound material constituted by silicon carbide. In addition, the reaction source may be the growth source and the doping source, which are constituted by silicon carbide.

The fabricated epitaxial wafer 100 may be applied to various electronic elements. The electronic element may include the Schottky barrier diode, the MESFET and the light-emitting element, but the embodiment is not limited thereto.

FIG. 12 is a sectional view showing a Schottky barrier diode according to an embodiment.

Referring to FIG. 12, the Schottky barrier diode according to the embodiment may include the substrate 110, the epitaxial layer 120, the drift layer 152, multiple doping regions 154, an anode contact 156 and a cathode contact 158.

The substrate 110 and the epitaxial layer 120 are the epitaxial wafer 100 according to the first, second and third embodiments.

As described above, the epitaxial layer 120 of the epitaxial wafer 100 according to the first, second and third embodiments includes the epitaxial layer 120 including the first semiconductor layer 130 that is grown at the low growth speed and the second semiconductor layer 140 that is grown at the high growth speed.

For example, the substrate 110 and the epitaxial layer 120 may be an n-type conductive layer, but the embodiment is not limited thereto.

The drift layer 152 may be formed on the epitaxial layer 120. The drift layer 152 may include silicon carbide and may be the n-type conductive layer, but the embodiment is not limited thereto.

Multiple doping regions 154, for example, may be formed on a top surface of the drift layer 152 by ion implantation.

The anode contact 156 may make contact with all of the drift layer 152 and the doping region 154 and may be formed on the drift layer 152. The anode contact 156 may be bonded by a Schottky junction to the upper surface of the drift layer 152 between the multiple doping regions 154, and may make contact with the doping region 154 by an ohmic contact.

The cathode contact 158 may be formed on a bottom surface of the substrate 110. The anode electrode 156 and the cathode electrode 158 may be metal, but the embodiment is not limited thereto.

When operating in a forward direction, the junction between the anode contact 156 and the drift layer 152 may be turned on at voltages lower than the junction between the doping region 154 and the drift layer 152. Therefore, the element shows a Schottky diode behavior at a lower forward direction voltage. In other words, the movement of the current in the element may depend on multiple carriers introduced widely over the Schottky junction in the low forward direction voltage. In general voltages, minority carriers are not introduced into the element, so the Schottky barrier diode may have a fast switching speed of a Schottky diode.

In a reverse direction bias condition, a depletion region formed by the PN junction between the doping region 154 and the drift layer 152 is extended to block a reverse direction current through the element such that the Schottky junction may be protected and the reverse direction leakage current in the element may be limited.

Meanwhile, the first semiconductor layer 130 may be used as the buffer layer, and the second semiconductor layer 140 may be used as the drift layer, but the embodiment is not limited thereto.

When the second semiconductor layer 140 is used as the drift layer, a separate drift layer 152 may not be required to be formed. In other words, the doping region 154 may be directly formed on the top surface of the second semiconductor layer 140.

FIG. 13 is a sectional view showing a MESFET according to the embodiment.

Referring to FIG. 13, the MSFET according to the embodiment may include the substrate 110, the epitaxial layer 120, a drift region 162, a body region 164, a source region 166, a body contact region 168, a gate insulator 170, a gate contact 172, a source contact 174, and a drain contact 176.

The substrate 110 and the epitaxial layer 120 constitute the epitaxial wafer 100 according to the first and second embodiments. Accordingly, the details of the epitaxial wafer 100 will be omitted below.

The substrate 110 and the epitaxial layer 120 may be N type conductive layers, but the embodiment is not limited thereto.

The drift layer 162 may be formed on the epitaxial layer 150. The drift layer 162 may include silicon carbide, and may be an N type conductive layer, but the embodiment is not limited thereto.

The body region 164 may be formed on the drift layer 162 through ion implantation. The body region 164 may be a P type doping region, but the embodiment is not limited thereto.

The source region 166 may be formed in the body region 164 adjacent to the contact region 168. The source region 166 may be an N type doping region, and the body contact region 168 may be a P+ doping region, but the embodiment is not limited thereto.

The gate insulator 170 may be formed on a top surface of the drift layer 162 and may extend to a top surface of the body region 164 between the source region 166 and the drift region 162.

The gate contact 172 may be formed on the gate insulator 170, the source contact 174 may be formed on the source region 166, and the drain contact 176 may be formed on a bottom surface of the substrate 110.

If voltage is sufficiently applied to the gate contact 172, a channel is induced to the surface of an element in the body region 164 between the source region 166 and the drift layer 162, so that the element may be turned on.

When the element is turned off, that is, there is no gate voltage sufficient to induce the channel, a MESFET structure may be the same as that of a PN diode including the body region 164, the drift layer 162, and the substrate 110. When the MESFET structure is biased in the inverse direction, the depletion region may be expanded toward the substrate 110 on the surface of the drift layer 162 in the junction between the body region 164 and the drift layer 162, which blocks the drain voltage.

Meanwhile, the first and second semiconductor layers 120 and 130 serve as buffer layers, and the third semiconductor layer 140 may serve as a drift layer, but the embodiment is not limited thereto.

When the third semiconductor layer 140 serves as a drift layer, the drift layer 162 may not be formed. In other words, the body region 164, the source region 166, and the body contact region 168 may be directly formed on the top surface of the third semiconductor layer 140.

FIG. 14 is a sectional view showing the light-emitting element according to the embodiment.

Referring to FIG. 14, the light-emitting element according to the embodiment may include the substrate 110, the epitaxial layer 120, a light emitting structure 188, and first and second electrodes 190 and 192.

The substrate 110 and the epitaxial layer 120 constitute the epitaxial wafer 100 according to the first and third embodiments. Accordingly, the details of the epitaxial wafer 100 will be omitted below.

The substrate 110 may not contain dopants.

The epitaxial layer 150 may be an N type conductive layer, but the embodiment is not limited thereto. In addition, although the first to third semiconductor layers 120, 130, and 140 include N type dopants in the epitaxial process, the embodiment is not limited thereto.

The light emitting structure 188 may generate light. The light emitting structure 188 may include a group III-V compound semiconductor material.

The light emitting structure 188 may include a first conductive semiconductor layer 182, an active layer 184, and a second conductive semiconductor layer 186.

For example, the first and second conductive semiconductor layers 182 and 186 may include one of GaN, AlGaN and AlInGaN.

For example, the first conductive semiconductor layer 182 may include an N type dopant, and the second conductive semiconductor layer 186 may include a P type dopant, but the embodiment is not limited thereto.

The active layer 184 may generate light having a wavelength corresponding to energy bandgap determined by a compound semiconductor material of the active layer 184 by recombining a first carrier, for example, an electron supplied from the first conductive semiconductor layer 182 with a second carrier, for example, a hole supplied from the second conductive semiconductor layer 186.

The active layer 184 may have a lamination structure formed by repeating one cycle including a well layer and a barrier layer several times.

The first electrode 190 may be provided on a portion of the first conductive semiconductor layer 182, and the second electrode 192 may be provided on a portion of the second conductive semiconductor layer 186.

The size of the second electrode 192 may correspond to the portion of the second conductive semiconductor layer 186, so that current can be mainly concentrated onto the portion of the second conductive semiconductor layer 186 corresponding to the size of the second electrode 192. In order to solve the above problem, a transparent conductive layer, for example, including ITO may be provided on an entire portion of the second conductive semiconductor layer 186. Accordingly, since current supplied from the second electrode 192 is spread due to the transparent conductive layer, the current is uniformly applied to the entire portion of the second conductive semiconductor layer 186, so that light can be uniformly generated.

The first and second electrodes 190 and 192 may include metal.

When power is supplied to the first and second electrodes 190 and 192, electrons are generated from the first conductive semiconductor layer 182, holes are generated from the second conductive semiconductor layer 186, and electrons and holes are recombined with each other in the active layer 184 to generate light.

Lights having various wavelengths may be generated depending on energy bandgaps of the active layer 184.

Therefore, the light-emitting element according to the embodiment may include a red light-emitting element, a green light-emitting element, a blue light-emitting element, an infrared light-emitting element, or an ultraviolet light-emitting element.

The light-emitting element according to the embodiment is packaged so that the light-emitting element may be applied to lighting, a display, or a backlight unit.

As described above, semiconductor electronic elements, such as a Schottky barrier diode, a MESFET, and a light-emitting element, can be fabricated using the epitaxial wafer 100 according to the first to third embodiments.

The epitaxial wafer according to the embodiment is applicable for an electronic element. The electronic element may be a switch element or a light-emitting element. For example, the switch element may be a Schottky barrier diode or a MESFET.

The invention claimed is:

1. An epitaxial wafer comprising:
a substrate; and
an epitaxial layer on the substrate, wherein the epitaxial layer includes silicon carbide,
wherein the epitaxial layer comprises:
a first semiconductor layer on the substrate, and
a second semiconductor layer disposed on the first semiconductor and having a thickness thicker than a thickness of the first semiconductor layer,
wherein a density of a Basal Plane Dislocation (BPD) of the first semiconductor layer is 30/cm$^2$ or less,
wherein a density of a Etch Pit Density (EPD) of the first semiconductor layer is 3,000/cm$^2$ or less, and
wherein a ratio of BPD/EPD of the first semiconductor layer is 0.01 or less.

2. The epitaxial wafer of claim 1, wherein any one of the first semiconductor layer and the second semiconductor layer comprises a silicon carbide nitride semiconductor layer.

3. The epitaxial wafer of claim 1, wherein any one of the first semiconductor layer and the second semiconductor layer comprises an aluminum silicon carbide semiconductor layer.

4. The epitaxial wafer of claim 1, wherein a doping concentration of the first semiconductor layer is higher than a doping concentration of the second semiconductor layer.

5. The epitaxial wafer of claim 1, wherein the substrate comprises silicon carbide.

6. The epitaxial wafer of claim 1, wherein the epitaxial layer comprises at least one of 3C-SiC, 4H-SiC and 6H-SiC.

7. The epitaxial wafer of claim 1, wherein the first semiconductor layer is a buffer layer, and the second semiconductor layer is an active layer.

8. The epitaxial wafer of claim 1, wherein a thickness of the first semiconductor layer is 0.5 μm to 1 μm.

9. A switch element comprising:
a substrate;
a first semiconductor layer on the substrate;
a second semiconductor layer on the first semiconductor layer;
an anode electrode on the second semiconductor layer; and
a cathode electrode under the substrate,
wherein the first semiconductor layer and the second semiconductor layer include silicon carbide,
wherein at least one of the first semiconductor layer and the second semiconductor layer comprises one of 3C-SiC, 4H-SiC and 6H-SiC,
wherein the second semiconductor layer has a thickness thicker than a thickness of the first semiconductor layer,
wherein a density of a Basal Plane Dislocation (BPD) of the first semiconductor layer is 30/cm$^2$ or less,
wherein a density of a Etch Pit Density (EPD) of the first semiconductor layer is 3,000/cm$^2$ or less, and
wherein a ratio of BPD/EPD of the first semiconductor layer is 0.01 or less.

10. A light emitting element comprising:
a substrate;
an epitaxial layer on the substrate; and
a light emitting structure disposed on the epitaxial layer and including at least a first conductive semiconductor layer, an active layer and a second conductive semiconductor layer,
wherein the epitaxial layer comprises:
a first semiconductor layer on the substrate; and
a second semiconductor layer on the first semiconductor layer,
wherein the first semiconductor layer and the second semiconductor layer include silicon carbide,
wherein at least one of the first semiconductor layer and the second semiconductor layer comprises one of 3C-SiC, 4H-SiC and 6H-SiC,
wherein the second semiconductor layer has a thickness thicker than a thickness of the first semiconductor layer,
wherein a density of a Basal Plane Dislocation (BPD) of the first semiconductor layer is 30/cm$^2$ or less,
wherein a density of a Etch Pit Density (EPD) of the first semiconductor layer is 3,000/cm$^2$ or less, and
wherein a ratio of BPD/EPD of the first semiconductor layer is 0.01 or less.

* * * * *